United States Patent [19]

Ohno et al.

[11] Patent Number: 5,091,692

[45] Date of Patent: Feb. 25, 1992

[54] PROBING TEST DEVICE

[75] Inventors: Akira Ohno, Yamanashi; Tetsuo Ohtsuka, Kawasaki; Naotaka Matsumoto, Tama, all of Japan

[73] Assignee: Tokyo Electron Limited, Tokyo, Japan

[21] Appl. No.: 636,094

[22] Filed: Dec. 31, 1990

[30] Foreign Application Priority Data

Jan. 11, 1990 [JP] Japan .................................. 2-4879

[51] Int. Cl.⁵ .................................................. G01R 1/02
[52] U.S. Cl. ................................. 324/158 F; 324/158 P;
358/106; 358/107
[58] Field of Search .................. 324/158 P, 158 F;
356/400, 401; 358/106, 107

[56] References Cited

U.S. PATENT DOCUMENTS

| | | | |
|---|---|---|---|
| 4,677,474 | 6/1987 | Sato et al. | 358/101 |
| 4,809,341 | 2/1989 | Matsui et al. | 358/106 |
| 4,820,975 | 4/1989 | Diggle | 324/158 F |
| 4,845,373 | 7/1989 | Jamieson et al. | 356/400 |
| 4,856,904 | 8/1989 | Akayama | 324/158 F |
| 4,864,227 | 9/1989 | Sato | 324/158 F |
| 4,872,052 | 10/1989 | Liudzius et al. | 358/106 |
| 4,875,005 | 10/1989 | Jerada et al. | 324/158 F |
| 4,887,892 | 12/1989 | Bachs | 358/107 |
| 4,896,278 | 1/1990 | Grove | 358/106 |
| 4,929,893 | 5/1990 | Sato et al. | 356/401 |
| 4,934,064 | 6/1990 | Yamaguchi et al. | 324/158 F |
| 4,943,767 | 7/1990 | Yokota | 324/158 F |
| 4,965,515 | 10/1990 | Karasawa | 324/73.1 |
| 4,989,082 | 1/1991 | Hopkins | 358/101 |

*Primary Examiner*—Kenneth A. Wieder
*Assistant Examiner*—William J. Burns
*Attorney, Agent, or Firm*—Oblon, Spivak, McClelland, Maier & Neustadt

[57] ABSTRACT

A probing test device is provided for contacting a plurality of probes with pads on a semiconductor wafer to be tested and supplying a test signal to a tester comprising a CPU for previously storing, as a reference image, the image signal obtained when the probes are correctly contacted with the electrode pads. The probing test device includes a mechanism for positioning these probes to be contacted with the pads on the wafer by moving the tested wafer relative to the probes, an optical system for image sensing those portions at which the probes are contacted with the pads, and a mechanism for positioning the optical system near to the pads by moving the optical system relative to the wafer. The CPU performs a comparison of the reference image signal with that image signal sensed for those portions at which the probes are contacted with the pads, which is picked up by the optical system to confirm whether or not both of these images coincide with each other, wherein the wafer is moved relative to the probes by the wafer positioning mechanism responsive to the result confirmed by the CPU.

13 Claims, 7 Drawing Sheets

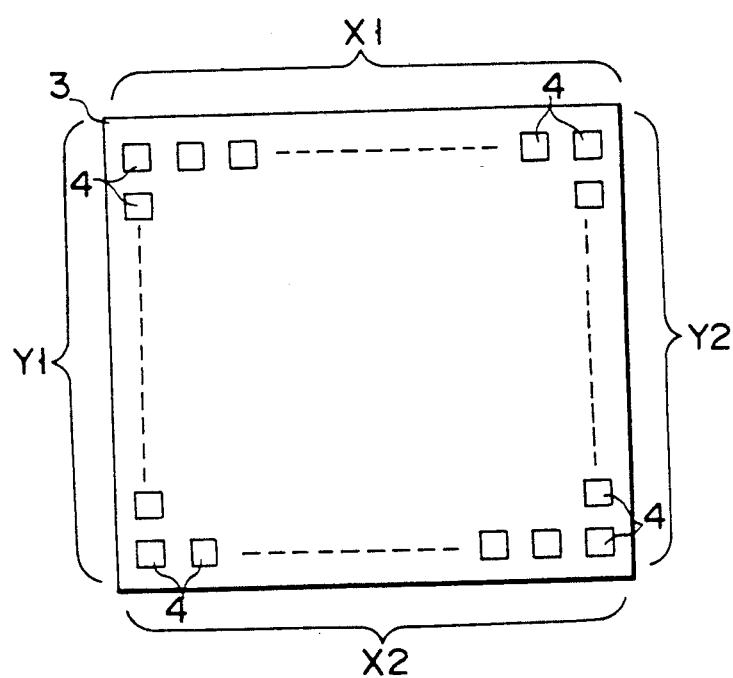
F I G. 10

PROBING TEST DEVICE

BACKGROUND OF THE INVENTION

1. Field of the Invention

The present invention relates to a wafer probing test machine for examining device patterns formed on a semiconductor wafer in the course of manufacturing semiconductor devices such as LSIs and, more particularly, it relates to a system for positioning electrode pads on a semiconductor chip relative to probes.

2. Description of the Related Art

The wafer test which is intended to test the electric characteristic of each device pattern on the semiconductor wafer is conducted at the final stage of preparing the wafer because the cost of this test becomes extremely high if it is conducted after the process of dicing semiconductor chips from the wafer. The wafer test is aimed at eliminating defective devices in the course of preparing the wafers and feeding back test results to the previous processes to enhance productivity and reliability of semiconductor devices thus produced.

As disclosed in U.S. Pat. Nos. 4,875,005 and 4,965,515, the wafer test system of this type comprises fundamentally a wafer probing test machine and a tester. Both of them are connected to each other by measuring lines, wherein probes are contacted with bonding pads on the device pattern and test complete and fail signals are exchanged between the machine and the tester when the test is started through control lines. It is needed in this wafer probing test machine that the ultrasmall bonding pads are positioned relative to the probes before the test so as to surely contact the probes with the bonding pads.

In the case of the conventional machine, a wafer stage 5 is moved in directions X, Y, Z and $\theta$ to position a chip 3, which is to be tested, just under an opening 6a of a probe card 6. The stage 5 is then lifted to contact tips of probes 7 with pads 4 on the chip 3 of the semiconductor wafer, as shown in FIG. 1.

The pads 4 are positioned relative to the probes 7 while viewing from just above those points at which the probes 7 are contacted with the pads 4 through a microscope 8 during the alignment (teaching) process, as shown in FIG. 2. The positioning of the pads relative to the probes is also sometimes carried out by marking needle tracks on the tops of the pads 4 by the probes 7 and viewing these needle tracks on the pads 4.

However, the semiconductor devices have been more and more highly integrated these days to have 16 and then 64 megabits. As they are highly integrated in this manner, the area of each pad 4 becomes smaller, numerous and the pitch at which the pads are arranged on the chip also becomes smaller Although the probe 7 is ultra-finely processed, the diameter of its tip is still 40 microns minimum. In the case of super LSIs which have 16 and 64 megabits, however, the number of pads formed on the chip amounts to more than several hundreds and the length of one side of the pad is extremely small, ranging from 40 to 60 microns. The tip of the probe 7, therefore, hides each pad 4 at the time when they are contacted with each other, thereby making it difficult to confirm the pads 4 in the view of the microscope.

This makes it difficult to confirm in the view of the microscope whether or not the probes 7 are fully contacted with the pads 4 at predetermined correct positions. In the case of the so-called bump pads, it is difficult to mark needle tracks on their tops. This makes it more difficult to confirm whether or not the probes are contacted with them. In the case of the semiconductor wafers on which patterns of the super LSIs having 16 and 64 megabits are formed, therefore, constant test results cannot be obtained, thereby making the reliability of the test low and the productivity of the semiconductor devices low, too.

SUMMARY OF THE INVENTION

The object of the present invention is therefore to provide a wafer probing test machine capable of positioning pads on the wafer relative to probes of the machine with a higher accuracy to carry out the wafer test with a higher reliability.

According to an aspect of the present invention, there can be provided a probing test device for contacting a plurality of probes with pads on an object to be tested and supplying test signal to a tester comprising; means for previously storing, as a reference image, the image signal obtained when the probes are correctly contacted with the pads; first means for positioning these probes to be contacted with pads by moving the tested object relative to the probes; means for image sensing those portions at which the probes are contacted with the electrode pads; second means for positioning the image sensing means near to the pads by moving the image sensing means relative to the tested object; and means for comparing the reference image signal with that image signal of their contacted portions which is picked up by the image sensing means to confirm whether or not both of these images coincide with each other.

When it is confirmed by the comparison means that both of the images do not coincide with each other, the tested object is further positioned relative to the probes by the first positioning means to again carry out the positioning of the pads relative to the probes.

The image sensing means includes lighting-up emitting blocks and a reflected-light detecting mirror. It is preferably that these emitting blocks and mirror are brought near to those portions at which the probes are contacted with the pads in a direction opposite to the direction in which the probes are introduced to contact the pads.

It is also preferable that the emitting blocks and mirror are located to obliquely light up from above and from front those portions at which the probes are contacted with the pads.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTIONS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 10 is a plan showing pads formed on a chip; and

DETAILED DESCRIPTION OF THE PREFERRED EMBODIMENTS

Some embodiments of the present invention will be described in detail with reference to the accompanying drawings.

Figure 1:
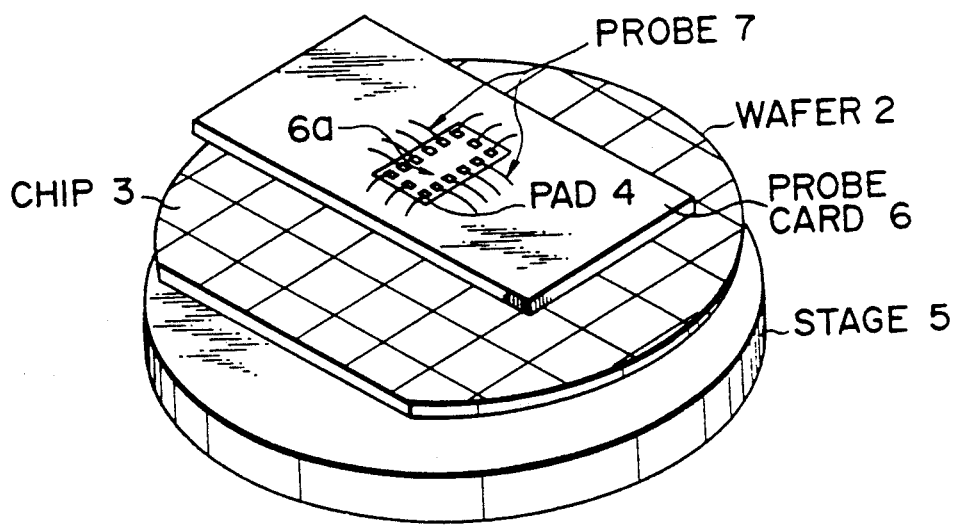
FIG. 1 is a perspective view showing a part of the test section of the conventional probing test device.
Figure 2:
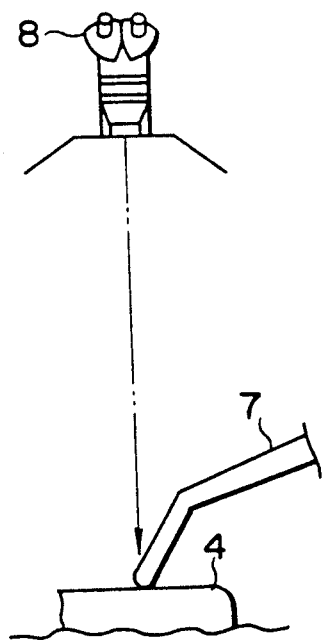
FIG. 2 shows a part of the conventional probing test device to explain the process of positioning probes on pads of each chip on a wafer.
Figure 3:
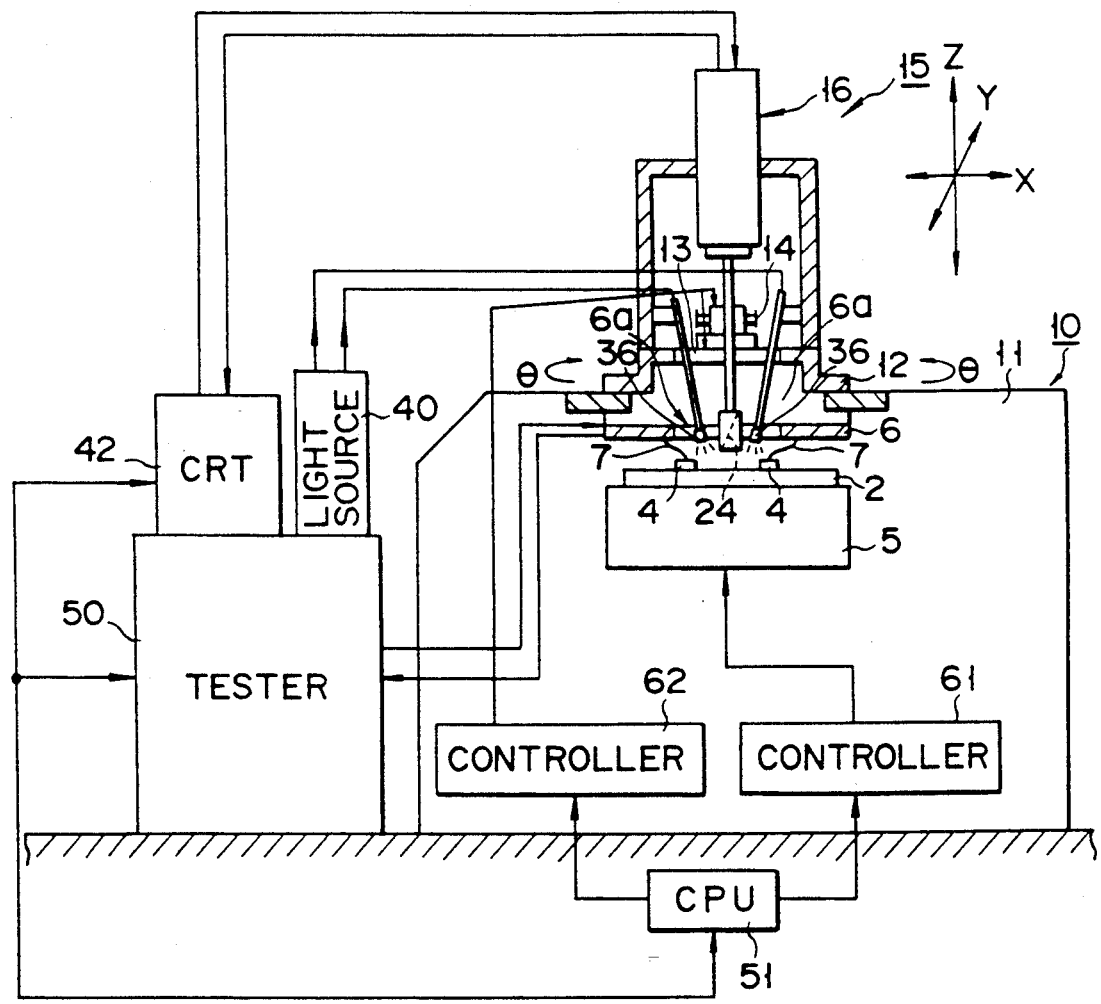
FIG. 3 shows the whole of an example of the probe device according to the present invention.

As shown in FIG. 3, a full automatic wafer probing test machine (or prober) 10 is installed on the floor of a clean room through an antivibration system (not shown) so as to test semiconductor wafers 2. Each test section of a prober body 11 is electrically connected to a tester 50. The prober 10 mainly includes a loader section (not shown), a wafer stage (or main chuck) 5, a probe card 6, an optical system 15, and first and second controllers 61 and 62.

The loader section (not shown) is located at the loading/unloading area of the prober 10, serving to pick up the semiconductor wafer 2 out of a cassette at the cassette station and carry it to the stage 5 after rought alignment.

The wafer stage 5 is located at the test section of the prober 10, serving to suck and hold thereon the semiconductor wafer 2 which is to be tested. The stage 5 includes an alignment system (not shown) for moving the stage 5 in directions X, Y, Z and $\theta$. The alignment system is controlled by the first controller 61.

The probe card 6 is fixed to a frame of the prober body 11, directing its lower surface toward the wafer stage 5. A circular opening 6a is formed at the center of the probe card 6, serving to guide a mirror 24 and emitting blocks 36 right above the wafer 2 on the stage 5. When the wafer 2 on the stage 5 is positioned relative to the probe card 6, a chip 3 on the wafer 2 which is to be tested can be viewed through the opening 6a. The diameter of the opening 6a of the probe card 6 is about 17-30 mm and the chip 3 is a square having a side of about 4-10 mm.

A plurality of probes 7 are arranged on the underside of the probe card 6. These probes 7 are electrically connected to the tester 50 through a measuring line.

The reference pattern of pads 4 on the chip 3 which is to be tested is converted to electric signal and previously stored in a memory of the tester 5 so as to use it as reference image information (which will be hereinafter referred to as "reference image").

The optical system 15 will be described referring to FIGS. 4 through 6.

The optical system 15 comprises an operating scope 16 provided with the mirror 24 and a light guide 30 connected with the halogen lamps 40a in the light source 40. The optical system 15 is arranged on a disk 12 which can be moved relative to the body 11. The disk 12 is linearly moved in directions X, Y and Z by an XYZ driver system 13 and also rotatingly moved in the direction $\theta$ (or round the vertical axis) by a manipulator 14. The XYZ driver system 13 and the manipulator 14 are controlled by the second controller 62.

Figures 4, 5:
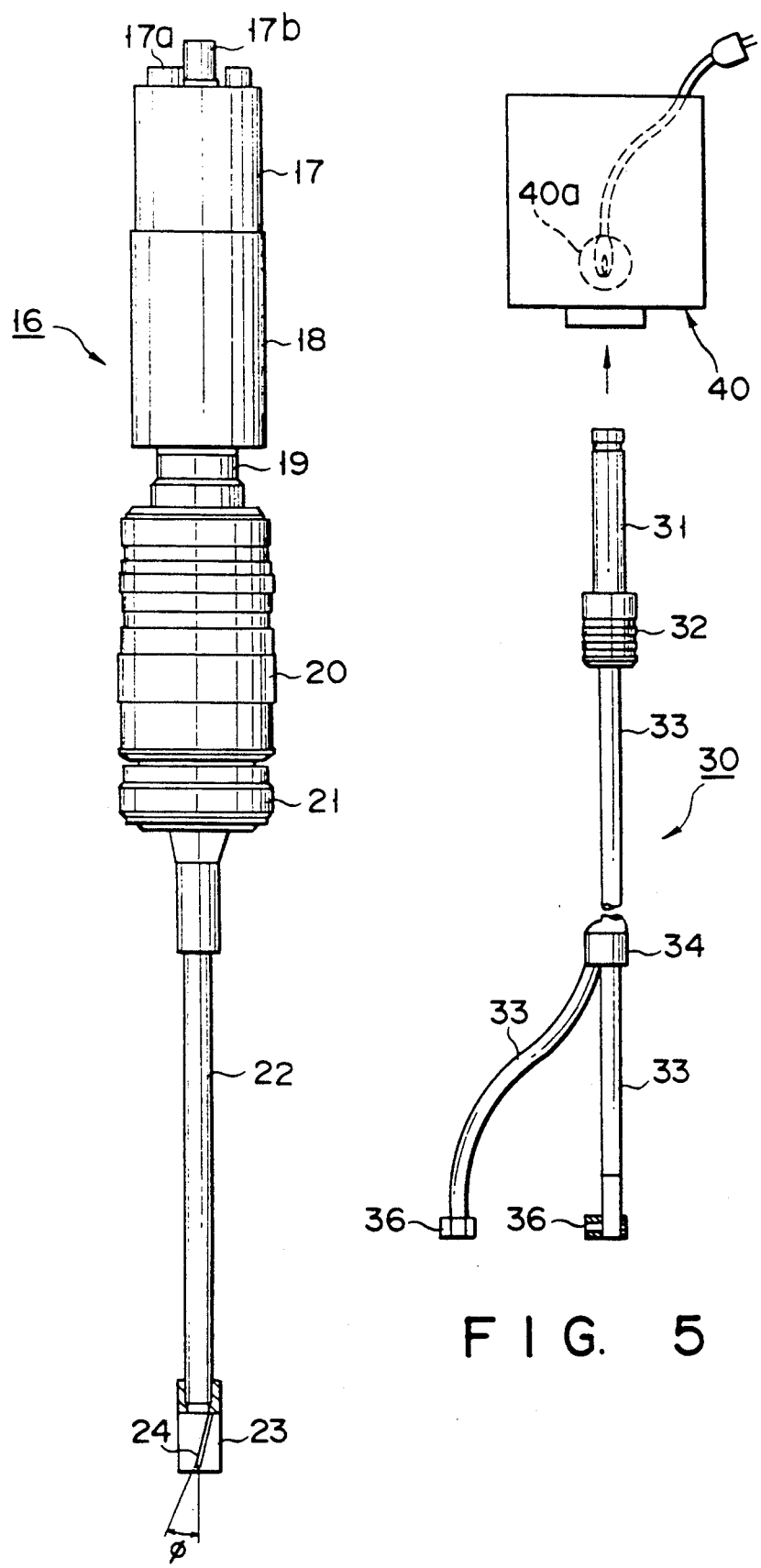
FIG. 4 is a front view showing an operating scope of the optical system.
FIG. 5 is a front view showing lamps and light guides of the optical system.

As shown in FIG. 4, a power unit 17 is arranged on the base side of the operating scope unit 16 and it is connected to a DC power source of a CRT 42 through a cable. A CCD camera 18 which is connected to the power unit 17 is then arranged on the base side of the operating scope unit 16 to catch light entering into it through lenses 20 and 21, which are connected to the CCD camera 18 through a C mount 19. The lenses 20 and 21 are of 35-75 mm zooming type to obtain an about 400 times field of view on the display of 9 inches CRT. Current flows into the CCD camera 18 through a terminal 17a, while light/current converting signal is sent from the CCD camera 18 to the CRT 42 through a terminal 17b in this case. An operating scope 22 is arranged next to the lens 21. The operating scope 22 has an outer diameter of about 9 mm and a length of about 150-200 mm.

A mirror block 23 is attached to the front end of the operating scope 22. The mirror 24 is housed in the mirror block 23 in such a way that the mirror 24 is tilted relative to the axis of the scope 22 at an angle of ($\phi$). It is preferable in this case that the angle ($\phi$) is in a range of $25\pm5°$. The mirror block 23 has a length of 30 mm and it is a square of 13-13 mm when sectioned. The mirror 24 may be selected in shape of plane, concave or convex.

As shown in FIG. 5, a plug 31 is arranged on the base side of the light guide 30 and it is connected to a terminal of a light source 40 through a cable. On the other hand, it is connected to one end of a fiber cable 33 through a coupler 32. The front end of the fiber cable 33 is branched into two by a branching member 34 and the emitting block 36 is attached to each of these branched fiber cables. The light source 40 has a rated voltage of 100V and a rated watt of 150W. The emitting block 36 is about 9 mm wide and about 6 mm long. The light source 40 is so variable as to adjust its light quantity and to distribute uniform light to the emitting blocks 36. The light source 40 is also forcedly cooled. A light emitting diode or a discharge lamp may be selected instead of the halogen lamp 40a.

Figure 6:
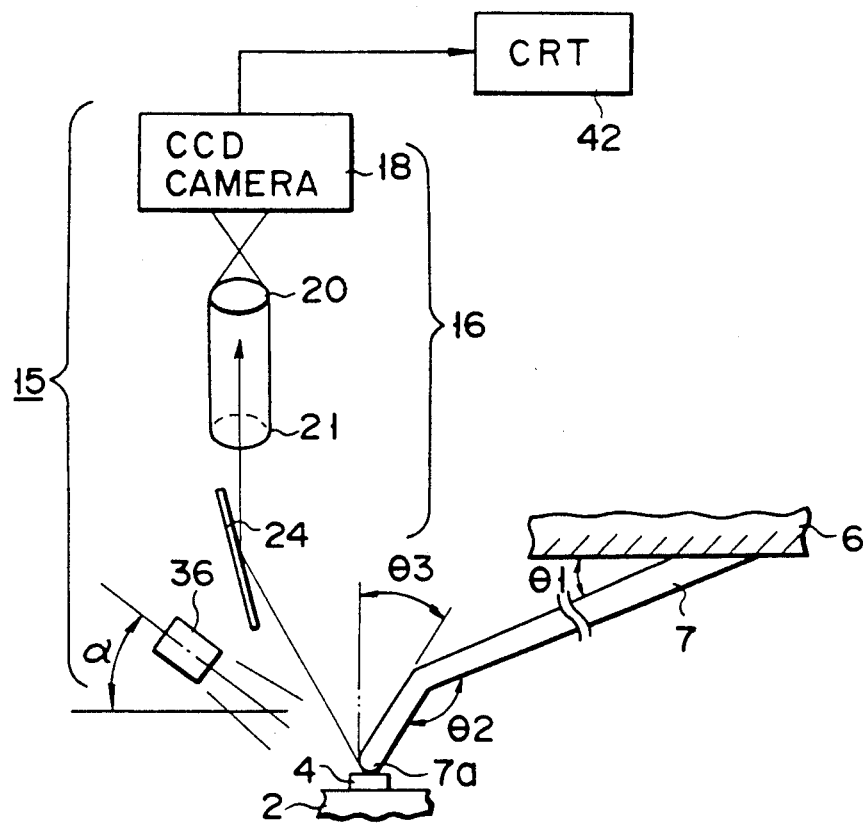
FIG. 6 is a rough sketch showing a point at which probe is contacted with its corresponding pad and also showing the optical system.
Figure 8:
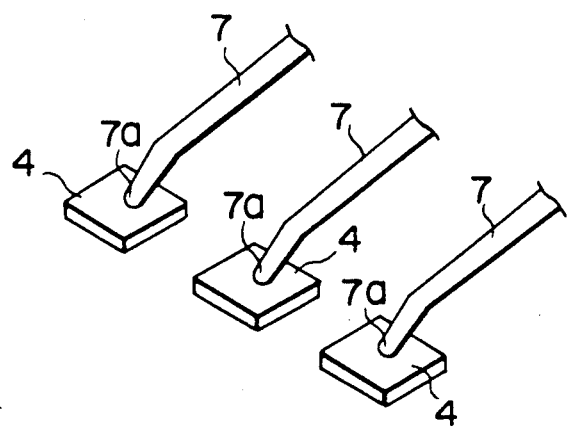
FIG. 8 is a perspective view showing those points at which the probes are contacted with the pads.

As shown in FIG. 6, the base of each probe 7 extends downward from the lower surface of the probe card 6 at an angle $\theta_1$. The front end portion of each probe 7 extends further downward from its base portion at an angle $\theta_2$ and tips 7a of the probes 7 are contacted with tops of the pads 4 at a certain pitch, as shown in FIG. 8. In other words, the tip 7a of each probe 7 is contacted with the top of each pad 4 at an angle $\theta_3$ relative to the vertical axis. It is preferable that the angle $\theta_1$ is in a range of 5°-9°, the angle $\theta_2$ in a range of 100°-106° and the angle $\theta_3$ in a range of 1°-11°. The height (or distance in the vertical direction) from the underside of the probe card 6 to the tip 7a of each probe 7 is in a range of 2.2–2.8 mm. The height (or distance in the vertical direction) form the underside of the probe card 6 to the bent point of each probe 7 is in a range of 2.0–2.3 mm.

As shown in FIG. 6, the optical axis of each emitting block 36 of the optical system 15 is tilted downward relative to the horizontal plane at an angle of $\alpha$.

Figure 7:
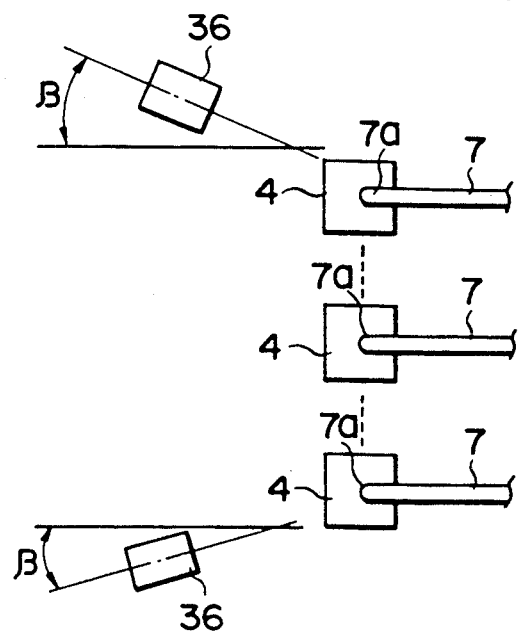
FIG. 7 is a plan showing a positional relation between the emitting blocks and those portions at which the probes are contacted with the pads.

As shown in FIG. 7, each of the paired blocks 36 of the light guide 30 is directed inward relative to the longitudinal axis of the probe 7 (or axis perpendicular to the column of the pads 4) at an angle of $\beta$ on a same horizontal plane. It is preferable that the angle $\beta$ is in a range of $45\pm10°$ and the angle $\beta$ in a range of $15\pm10°$. When the emiting blocks 36 are set in this manner, those portions at which the tips 7a of the probes 7 are contacted with the tops of the pads 4 can be lighted up more distinctly.

When their contacted points are viewed from the side of the mirror 24 of the optical system 15, they appear like perspective images as shown in FIG. 8. This enables shapes of bump pads and tips 7a of the probes 7 to be three-dimensionally viewed, thereby making it easier to position the probes 7 relative to the pads 4.

Figure 9:
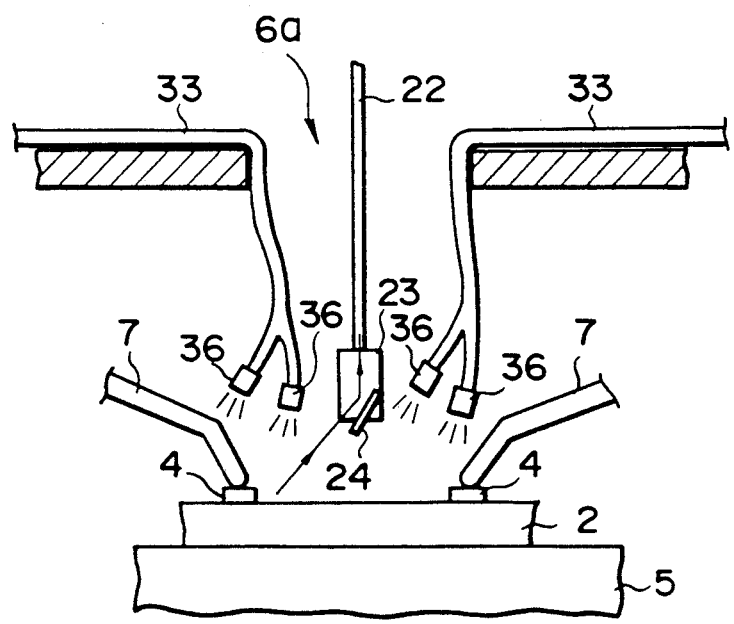
FIG. 9 is a partly-sectioned view intended to explain how emitting blocks and light guides of an optical system are arranged in the case of another embodiment of the probe device according to the present invention.

The light guide 30 may be attached to the probe card 6 as shown in FIG. 9. More specifically, the fiber cables 33 are extended on the top of the probe card 6 to introduce the emitting blocks 36 near to the wafer 2 through the opening 6a. When the light guide 30 is arranged in this manner, the lighting-up section of the optical system 15 can be made integral to the probe card 6, thereby making it easier to operate the optical system 15.

Figure 11:
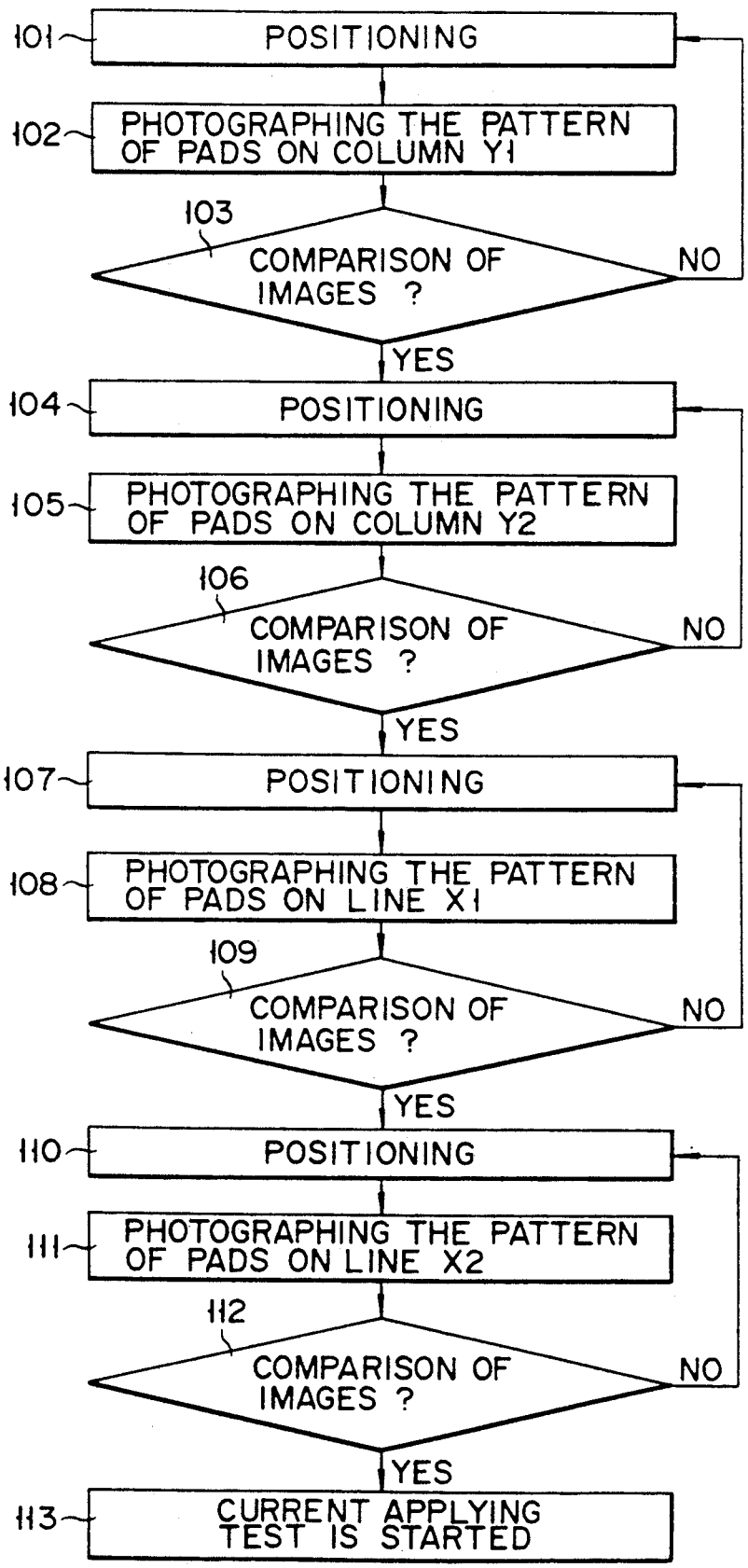
FIG. 11 is a flow chart intended to explain the positioning process before the current applying test is started.

Referring to FIGS. 10 and 11, the process of positioning the probes 7 relative to the pads 4 of each chip 3 on the wafer 2 before the wafer 2 is tested will be described.

(I) A sheet of the semiconductor wafer 2 is picked up from the loading/unloading section and then carried to the test section. The wafer 2 is mounted on the stage 5 and sucked and held there. The stage 5 is moved in directions X, Y, Z and $\theta$ to position the opening 6a of the probe card 6 just above the chip 3 which is to be measured. The optical system 15 is moved in the directions X, Y, Z and $\theta$ to direct the mirror 24 and the emitting blocks 36 toward the pads 4 on a column $Y_1$ on the chip 3 (step 101 "see FIG. 10"). The mirror 24 and the emitting blocks 36 are thus positioned separating optional from the top of the wafer 2. The stage 5 is lifted at the positioning step 101 to virtually contact the probes 7 with the pads 4 on the column $Y_1$. This positioning step is automatically controlled by a CPU 51 of the prober 10 and by the first and second controllers 61 and 62.

(II) The light source 40 is switched on and the lamps 40a are turned on to light up the pads 4 on the column $Y_1$. Light reflected by those points at which the probes 7 are contacted with the pads 4 is caught by the mirror 24 and introduced into the CCD camera 18. A pattern of the pads 4 on the column $Y_1$ is vividly picked up by the CCD camera 18 (step 102) because angles at which light is shot from each emitting block 36 and at which light reflected is caught by the mirror 24 are set as desired. When optical signal is converted to electric one at the CCD camera 18 and image information which is represented by the electric signal is applied to the CRT 42, an image which denotes the pattern of the pads on the column $Y_1$ and which is magnified about 400 times is displayed on the screen of the CRT 42.

(III) When the image information which is denoted by the electric signal is applied from the CRT 42 to the CPU 51, the information of "reference image" is called from the memory and compared with the image detected (step 103). This comparison is full-automatically carried out in the CPU 51.

The above process can be switched from automatic to manual operation. Viewing the image on the screen of the CRT 42, the operator can find whether or not the probes 7 are correctly contacted with the pads 4. In the case where the process is manually conducted by the operator, the positioning step is carried out by the Joy stick.

It is not necessary in this case that the probes 7 are positioned relative to all of the pads 4 on the column $Y_1$, but they may be positioned relative to only some pads 4 which are located at both ends of the column $Y_1$.

When the comparison of the pattern image of the pads on the column $Y_1$ with the reference image is confirmed as being accepted, the process is advanced to a next step 104. But if not, the process is returned to the step 101 and the positioning of the probes 7 relative to the pads 4 on the column $Y_1$ is again carried out.

(IV) The optical system 15 is rotated by 180° by the manipulator 14 at the step 104 to bring the pads 4 on a column $Y_2$ into the view of the CCD camera 18.

Another pattern of the pads on the column $Y_2$ is picked up by the CCD camera 18 (step 105), similarly to the case of the step 102.

(V) Another image of the pad pattern on the column $Y_2$ is compared with the reference image (step 106), similarly to the case of the step 103. If the comparison of the pattern image of the pads on the column $Y_2$ with the reference image is confirmed as being accepted, the process is advanced to a next step 107, but if not, the process is returned to the step 104 and the positioning of the probes 7 is again repeated.

(VI) The optical system 15 is rotated by 90° by the manipulator 15 at the step 107 to bring the pads 4 on a line $X_1$ into the view of the CCD camera 18. A further pattern of the pads on the line $X_1$ is picked up by the CCD camera 18 (step 108), similarly to the case of the steps 102 and 105.

(VII) A further image of the pad pattern on the line $X_1$ is compared with the reference image (step 109), similarly to the case of the steps 103 and 106. If the comparison of the pattern image of the pads on the line $X_1$ with the reference image is confirmed as being accepted, the process is advanced to a next step 110. But if not, the process is returned to the step 107 and the positioning of the probes 7 is again repeated.

(VIII) The optical system 15 is rotated by 180° by the manipulator 14 at the step 110 to bring the pads 4 on a line $X_2$ into the view of the CCD camera 18. A still further pattern of the pads 4 on the line $X_2$ is picked up by the CCD camera 18 (step 111), similarly to the case of the steps 102, 105 and 108.

A still further image of the pad pattern on the line $X_2$ is compared with the reference image (step 112). similarly to the case of the steps 103, 106 and 109. If the comparison is confirmed as being not accepted, the process is returned to the step 110 and the positioning of the probes 7 is again repeated.

If the comparison is confirmed as being accepted, the current applying test relative to the semiconductor is started while applying test current from the tester 50 to the probes 7 (step 113). When the current applying test is finished, the wafer stage 5 is lowered and moved in the directions X and Y to position a next chip 3 relative to the opening 6a of the probe card 6. The above-described steps 101-113 are then repeated. When the current applying test is finished relative to all of the chips 3 on the semiconductor wafer 2, this wafer 2 is carried from the test section to the loader section (not shown).

Although the optical system 15 is positioned at all times at the center of the opening 6a of the probe card 6 in the above-described examples, it may be swung and retreated to some position after the positioning of the probes 7 is finished. When the optical system 15 is arranged in this manner, it becomes unnecessary that the optical system 15 is gone away from the probe device 10 even in a case where an additional test head is arranged on the top section of the probe device 10.

Although some pads 4 which are located at both ends of each of the lines $X_1$, $X_2$ and the columns $Y_1$, $Y_2$ are picked up in the above-described examples to position the probes 7 relative to these pads 4, the positioning of the pads 4 and the probes 7 can be made only by image sensing those pads 4 which are located at both ends of each of the line $X_1$ and the column $Y_1$ alone.

Although semiconductor wafers are used as matters to be tested in the above-described examples, they may be LCD substrates.

According to the above-described examples, those points at which the probes 7 are contacted with the pads 4 can be caught as perspective images and this enables shapes of the bumps and of the tips of the probes to be three-dimensionally viewed. Conventionally, however, they were caught as planar images and this made it difficult to surely confirm whether or not the probes are contacted with the pads. In the case of the above-described probe device, however, shadows of the probes 7 can be virtually eliminated and their contacted points can be better contrasted with their environment. This enables their contacted points to be surely confirmed.

According to the present invention, it can be surely confirmed whether or not the tips of the probes are contacted with the electrode pads on a wafer chip even in the wafer test of those super LSIs which have several hundreds of the electrode pads on the chip. This enables test results to be obtained with a higher reliability. The productivity of the super LSIs can be thus enables to a greater extent.

Further, those points at which the probes are contacted with the pads can be caught as perspective images even in a case where a plurality of ultra-small electrode pads which are of the bump type are arranged on a chip at a ultra-small pitch. Therefore, their contacted points are better contrasted with their environment without being shadowed by the tips of the probes. This makes it possible to surely confirm their contacted points and the reliability of the wafer test can be thus enhanced to a greater extent, as compared with that of the conventional wafer test.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A probing test device for contacting a plurality of probes with pads on an object to be tested and supplying a test signal to a tester comprising:

means for previously storing, as a reference image, the image signal obtained when the probes are correctly contacted with the pads;

first means for positioning these probes to be contacted with the pads by moving the tested object relative to the probes;

means for image sensing those portions at which the probes are contacted with the pads including a lighting-up means and a reflected-light detecting means to allow those portions at which the probes are contacted with the pads to be caught as perspective images;

second means for positioning the image sensing means near to the pads by moving the image sensing means relative to the tested object; and means for comparing the reference image signal with the image signal of their contacted portions which is picked up by the image sensing means to confirm whether or not both of these images coincide with each other;

wherein the tested object is moved relative to the probes by said first positioning means responsive to the result confirmed by said comparison means.

2. The probing test device according to claim 1, wherein said lighting-up and reflected-light detecting means are introduced near to the tested object through an opening of a probe card which is provided with the probes.

3. The probing test device according to claim 1, wherein said lighting-up and reflected-light detecting means are introduced near to the tested object through the center of an opening of a probe card which are provided with the probes.

4. The probing test device according to claim 1, wherein said lighting-up means includes two emitting blocks branched from a light guide.

5. The probing test device according to claim 4, wherein said two emitting blocks are positioned to shoot light in a direction opposite to the direction in which the probes are brought to contact the pads.

6. The probing test device according to claim 1, wherein said lighting-up means includes a light source which can adjust its light quantity.

7. The probing test device according to claim 1, wherein said lighting-up means is attached to the probe card which is provided with the probes.

8. The probing test device according to claim 1, wherein said reflected-light detecting means has a CCD camera which is of the zooming type.

9. The probing test device according to claim 1, wherein said reflected-light detecting means has a mirror which is inclined relative to the vertical axis.

10. The probing test device according to claim 1, wherein said first positioning means includes a system which serves to move a stage, on which the tested object is mounted, in directions X, Y, Z and $\theta$.

11. The probing test device according to claim 1, wherein said second positioning means includes a system which serves to move the image sensing means in the directions X, Y, Z and $\theta$.

12. The probing test device according to claim 9, wherein said mirror is inclined with respect to the vertical axis by an angle of $25° \pm 5°$.

13. The probing test device according to claim 6, further comprising cooling means for forcibly cooling said light source.

* * * * *